United States Patent [19]

Horvath et al.

[11] Patent Number: 5,001,445
[45] Date of Patent: Mar. 19, 1991

[54] TRANSPORT PROCESSOR FILTER

[75] Inventors: Anton F. Horvath, Santa Ana; Gene H. Hostetter, Huntington beach, both of Calif.

[73] Assignee: Hughes Aircraft Company, Los Angeles, Calif.

[21] Appl. No.: 342,718

[22] Filed: Apr. 24, 1989

Related U.S. Application Data

[63] Continuation of Ser. No. 927,293, Nov. 5, 1986, abandoned.

[51] Int. Cl.[5] .............................................. H03H 7/30
[52] U.S. Cl. ..................................... 333/166; 333/165; 350/311
[58] Field of Search ................ 333/134, 129, 132, 138, 333/166, 165, 167, 168; 455/610, 617; 350/313–316, 311; 364/724.01, 724.03, 724.06, 724.11, 726, 724.09

[56] References Cited

U.S. PATENT DOCUMENTS

| | | | |
|---|---|---|---|
| 2,897,442 | 7/1959 | Wright et al. | 333/166 X |
| 3,307,190 | 2/1967 | Clay Jr., et al. | 333/166 X |
| 3,594,795 | 7/1971 | Thor et al. | 333/166 X |
| 3,691,486 | 9/1972 | Borsuk et al. | 333/166 |
| 4,293,831 | 10/1981 | Lueder | 333/166 X |
| 4,541,068 | 9/1985 | Tower | 333/165 X |

FOREIGN PATENT DOCUMENTS

| | | | |
|---|---|---|---|
| 2223940 | 11/1972 | Fed. Rep. of Germany | 333/166 |
| 0264117 | 12/1985 | Japan | 333/196 |

OTHER PUBLICATIONS

Roy et al., "Design of MTI Detection Filters . . . Periods", IEEE Trans. on Circuit Theory, vol. CT-17, No. 4, Nov. 1970, pp. 604–612.
Robinson et al. "Principles of Digital Filtering", Geophysics, vol. XXIX, NO. 3, Jun. 1964, pp. 395–404.
Liu, "Effect of Finite Word . . . of Digital Filters-a Review", IEEE Trans. on Circuit Theory, vol. CT-18, No. 6, Nov. 1971, pp. 670–677.
Agrawal, "An Algorithm . . . Square Filters", IEEE Transactions on Acoustics, Speech and Signal Processing, vol. ASSP-25, No. 5, Oct. 1977, pp. 410–414.
Urkowitz, "Analysis and Synthesis of Delay Line Periodic Filters", The Transactions on Circuit Theory, No. 2, Jun. 1957, pp. 41–53.

Primary Examiner—Eugene R. Laroche
Assistant Examiner—Seung Ham
Attorney, Agent, or Firm—Wanda K. Denson-Low

[57] ABSTRACT

A new structure for electro-magnetic signal filters is described. The structure of the invention incorporates ideal time lag elements having delay values selected to match an arbitrarily selected set of frequencies matched to a desired frequency response and connected in a cascade array by second filter elements which null the frequency filtered by the preceding array, the output of which is summed to provide a composite output with the desired frequency response. The resultant filters are easily implemented in conventional hardware and the techniques may be applied to a broad range of the electro-magnetic spectrum by the choice of appropriate components.

9 Claims, 6 Drawing Sheets

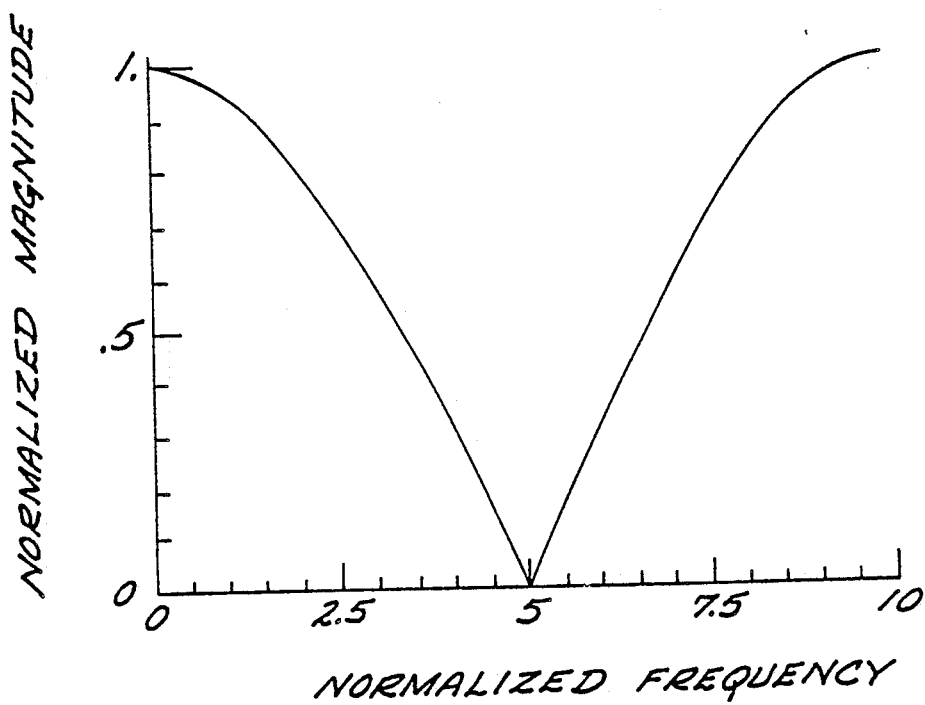
FIG. 7
FIG. 8
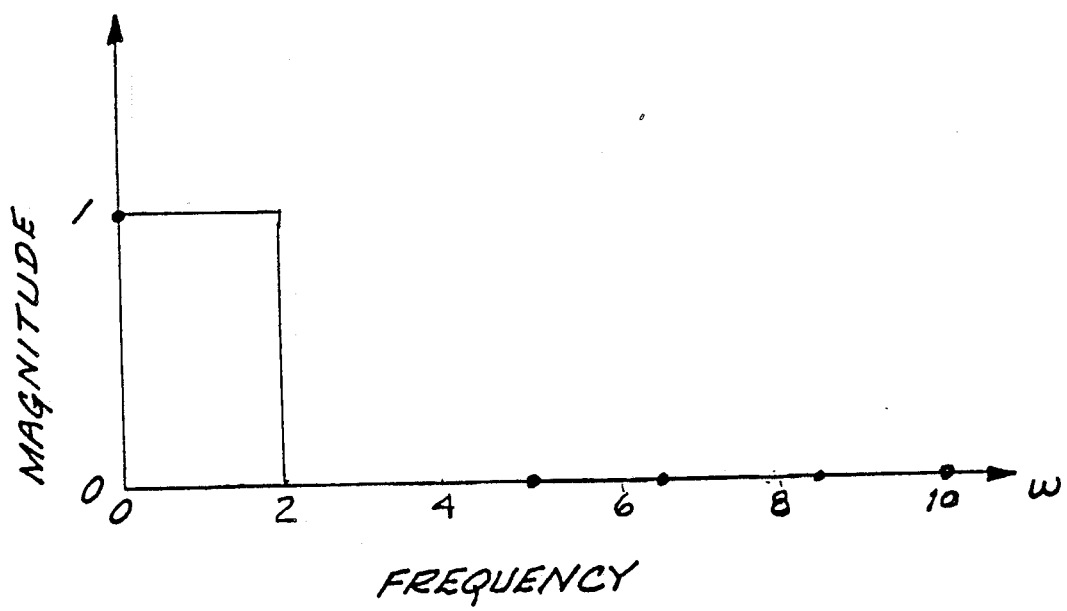

TRANSPORT PROCESSOR FILTER

This application is a continuation of application Ser. No. 927,293, filed Nov. 5, 1986 (now abandoned).

FIELD OF THE INVENTION

The invention relates to electronic and optical filters designed to control the passage of various components of an input signal.

BACKGROUND OF THE INVENTION

While the term filter may be broadly used to describe any of a class of components or systems that separate and attenuate the passage of certain portions of an input to the filter, the present invention is primarily concerned with filters used in electronic systems to produce a predetermined frequency-amplitude output and a desired phase relationship for that output. Analogous concepts may also be used to configure filters in the electromagnetic spectrum, including light waves, provided that the appropriate component choices are made. Soon after the development of practical electronic circuits, it became obvious that means to filter a signal in order to enhance some frequencies and suppress others would be desirable. Classical filtering techniques led to the development of the theory of tuning circuits in the late 19th century and the resonance circuits developed during that time played a significant role in the development of the radio and the telephone. As electronic systems became more sophisticated, filter designs improved beyond their simple forms to include more complex circuits incorporating resistors, inductors and capacitors (RLC) components. While circuits incorporating such components approached new levels of sophistication, they were still passive in that the component characteristics were unalterable by electronic control. One important characteristic of such passive filters was that they could be described by a mathematical expression of their frequency behavior consisting of linear, lumped parameter equations. Further development of filter design for electronic circuits included the addition of active components such as amplifiers which allowed the elimination of inductors, thereby substantially reducing the weight and size of many of the filters. Such active-RC filters became widely used in a variety of advanced electronic systems including many in current use.

Statistical filtering theory has been developed to improve signal detection of complex electro-magnetic signals. Previous work in filter theory assumed that a signal of interest could be separated from an undesired signal based on the desired signal's frequency, since the frequencies composing the desired signal were substantially different from those of the unwanted signal. However, such approaches proved inadequate when the frequency content of both signals overlapped or when statistical information concerning the signals was unavailable. While some solutions to this problem were adequately addressed by an assumption of stationary statistics of the signal being detected, it was not until the development of the Kalman time domain, steady state filter theory was developed, that an adequate solution was available for such statistically based filtering of information signals.

Meanwhile, the rapid development of digital computers led to the development of digital filtering theories that could operate on digital signals. Naturally, a large part of the early work in digital filters focused on building good approximations of existing analog filters. Soon, however, it became evident that the development of efficient algorithms for calculating the discrete Fourier transform would allow the development of many previously unavailable filter capabilities.

An important application for filters in modern electronic systems is the filtering of signals in such a way that the output spectrum amplitude-frequency content may be chosen by the designer and a phase shift relationship across the frequency spectrum may also be specified. The mathematical expression of such a digital filter is similar to the passive analog component filter type linear, lumped parameter equations. While such filters have provided sophistication and capabilities beyond those which were achievable with the passive element and active element types previously available, they have nonetheless tracked improvements in digital components and digital computers and often merely represent a digital implementation of the previous theories. Because of the speed limitations of multipliers used in active digital or analog filter systems, a current problem in filter design involves the development of efficient methods for designing filters that may be fabricated with a minimum number of multipliers or with multipliers of unity coefficient. These approaches have included methods to reduce the magnitude of the multiplication load demanded of the filtering elements and the inclusion of finite impulse response elements in order to build filters that have a multiplierless implementation. While such approaches have been suggested, they have either been limited by their ability to perform demanding filtering functions or, in the alternative, have required the use of multiplier filter elements which, while not of high multiplication factors, nonetheless require the inclusion of numerous non-unity multiplier elements.

While the above developments have improved the ability of designers to configure filter systems with improved amplitude-phase performance, the mathematical expressions for such filters are still linear, lumped parameter forms that limit the capabilities of such filters. There remains, therefore, a continuing need for filters that employ only delay elements and addition or subtraction elements and which may be simply and easily designed and implemented while retaining high performance in the filtering process.

SUMMARY OF THE INVENTION

The present invention provides a method for designing filters using only delay elements and addition or subtraction elements. The term delay elements is accepted in the art to include any of the class of filter elements characterized by the relationship $e^{\tau s}$ in which the delay is $\tau$. The invention is incorporated in a new filter structure that employs combinations of filter elements incorporating either delays or addition/subtraction functions in combination with a summation means to provide an output of the filter with the desired frequency amplitude and phase characteristics. The term transport processor filters has been coined to describe this new arrangement for filters since it incorporates elements with ideal time lags or "transportation delays" to form a desired frequency response. The method of design and structure of the present invention is easily and economically implemented, provides for high filtering performance and has capabilities unavailable in linear, lumped parameter filter concepts.

The basic structure of the present invention utilizes only delay and addition/subtraction elements in a cascaded parallel array arrangement with a common input, their outputs being summed to provide a single output with the desired frequency-amplitude-phase response. The filter structures may include feedback paths and therefore constitute an infinite impulse response filter or exclude feedback paths which then results in an finite impulse response filter.

A feature of the present invention is a design methodology that allows the efficient and straight-forward design and configuration of a processor that yields a finite impulse response. Using this design process, a designer first determines the desired filter response in amplitude and phase as a function of the frequency of the input signal. The designer then defines arbitrary nulls and zero phase regimes for the desired filter characteristic and chooses a complementary set of frequencies for the filter elements to be incorporated in the filter. Then, utilizing the basic cascade array structure of the present invention, the designer chooses a structure including a plurality of filter elements incorporating delays in their transfer functions. For each of the delay elements chosen in the previous step, the delay coefficient for the transfer functions of each sub-filter are computed such that the frequency response matches the frequency response desired for the frequency chosen for that element. The designer then chooses a sub-filter that has the characteristic of placing a zero at the frequency point of the previous step. The designer iterates the above process for each frequency using as an input to the next phase of the cascade the output of the zero filter chosen in the previous step. The designer assembles the above elements defined in the cascaded structure chosen, the output of which is summed as an output of the filter.

The resultant filter has many important design characteristics, among them that the frequency response function for a finite impulse response structure is not a polynomial in the frequency variable. Therefore, the majority of existing filter design techniques that are commonly implemented either on polynomials in frequency or on a ratio of polynomials in frequency are not applicable. Second, although the use of multipliers has been excluded for the subject invention, the algebraic sign associated with each path implicitly inserts the effect of a multiplication by plus or minus one. Therefore, the present invention can be included in the class of filters that are constrained to unity coefficient multipliers with their atttendant advantages. Third, for a given delay in the transfer function of each element, the time delay constant is periodic as a function of frequency. However, the frequency response of the entire filter will not be periodic, in general, since irrational value delays are included in the set of delay coefficients. Also, the frequency response of the filter is a complex valued function which can be easily implemented in hardware once the delay coefficients are determined. For the above reasons, the present invention represents important improvements over previously available digital or analog filters since it is easily designed, is capable of high performance in the filtering process and may be easily implemented in hardware as either an analog or digital filter processor. Other features and advantages of the present invention will become apparent from the following detailed description taken in conjunction with the accompanying drawings which illustrate, by way of example, the principles of the invention.

BRIEF DESCRIPTION OF THE DRAWINGS

FIG. 7 is the output magnitude-frequency plot of the filter of FIG. 6 (for $b = \pi/5$).

FIGS. 8 and 9 are a magnitude-frequency plot of an ideal low pass filter for the example of the present invention.

DETAILED DESCRIPTION OF THE INVENTION

As shown in the exemplary drawings, the present invention is embodied in a filter 10 of the type having an array of cascaded filter elements 12 having a common input, the output of each filter element 12 being summed by summing means 14 to provide an output with the desired frequency amplitude-phase characteristics.

Figure 1:
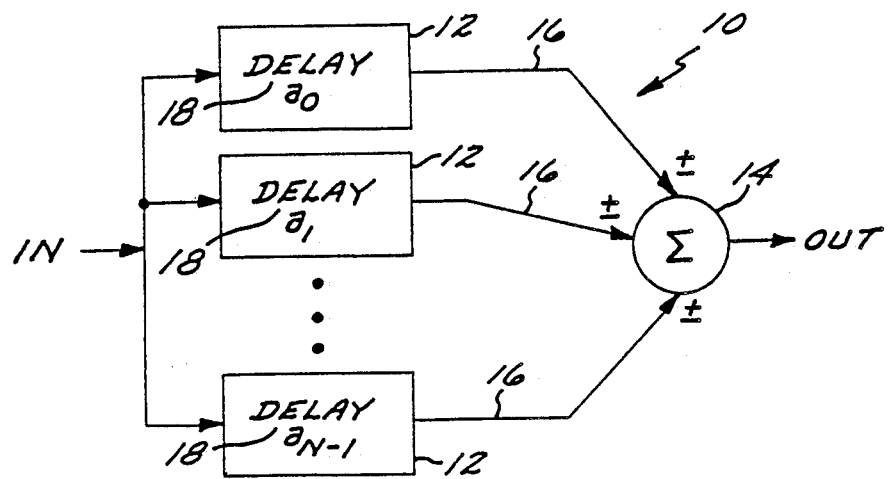
FIG. 1 illustrates the basic structure of the invention, including the array of filter elements and the summing means to provide a composite output.

FIG. 1 illustrates the basic structure for a filter according to the present invention with finite impulse response in which the algebraic signs associated with each of the output paths 16 of different filter elements 12 may be chosen as either positive or negative. In general, the algebraic signs for each path 16 will be a function of the filter design process and the desired frequency response. The delay values 18 selected for each filter element 12 are ordered such that $a_0 \leq a_1 \leq \ldots \leq a_{N-1}$ where $a_i$ corresponds to the value of the ideal delay associated with the ith path. For $a_0 \geq 0$, the resultant filter will be causal. The resulting frequency response for this basic structure as a function of is

EQUATION 1

$$F_N(W) = \pm e^{-ja_0\omega} \pm e^{-ja_1\omega} \pm \ldots e^{-ja_{N-1}\omega} = \sum_{i=0}^{N-1} \pm e^{-ja_i W}$$

(recall, the Laplace transform for an ideal time delay $\tau$, is $e^{-\tau s}$).

Several important aspects related to filters according to the present invention are revealed in Eq. 1. First, the frequency response function, $F_N(\omega)$, for finite impulse response structures is not, in general, a polynomial in the frequency variable, $\omega$. Therefore, the majority of existing filter design techniques that are commonly implemented either on polynomials in $\omega$ or on a ratio of polynomials in $\omega$ are not applicable. Second, although the use of multipliers is not required for the present invention, the algebraic sign associated with each path 16 implicitly inserts the effect of a multiplication by either $+1$ or $-1$, as appropriate. Therefore, filters according to the present invention can be included in the class of filters that are constrained to unity coefficient multipliers with their attendant advantages. For a given choice of delay coefficient, $a_i$, the expression $\exp(-ja_i\omega)$ is periodic as a function of frequency; however, the frequency response $F_N(\omega)$ will not be periodic in general since irrational-valued delays are included in the set of delay coefficients. Furthermore, the frequency response, $F_N(\omega)$ is a complex-valued function of the class that is relatively easily implemented in hardware once the delay coefficients are determined.

When a mean-square performance function is minimized with respect to the delay coefficients associated with a transport processor, the resultant set of equations is nonlinear and not easily solved. The common techniques for solving these equations involve search routines over the space of delay parameters. Unfortunately, the results from these search routines do not ensure that the global minimum associated with a performance measure is achieved.

Therefore, an innovative design procedure is used for the present invention that provides a systematic approach for determining the delay parameters for a filter constructed according to the invention. The sequential design technique allows the designer to choose an arbitrary set of frequencies at which the resultant frequency response will exactly match the desired frequency response. The number of design frequencies, M, is increased until the overall frequency response becomes a good approximation of the desired overall frequency response.

Figure 2:
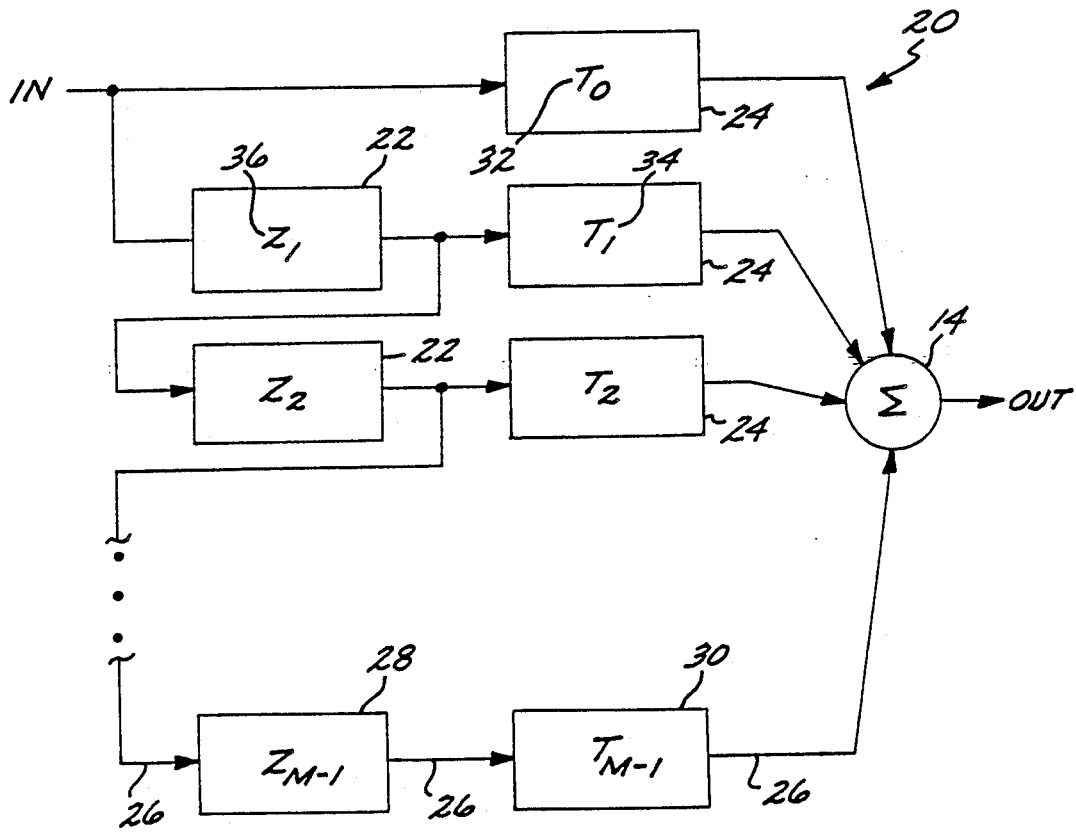
FIG. 2 illustrates the structure of the present invention which incorporates a cascaded parallel array of filter elements utilizing nulling sub-filters to prevent previously obtained desired frequency response points from being affected by succeeding filters.

FIG. 2 illustrates the basic structure 20 used by the design procedure of the present invention where each Z transfer function 22 and T transfer function of the present invention has the same structure as described in Eq. 1 and illustrated schematically in FIG. 1.

Each path in the parallel structure in FIG. 2 will allow the desired frequency response to be achieved at a single frequency. The set of M design frequencies can be arbitrarily ordered as $\omega_0, \omega_1, \ldots \omega_{M-1}$. Since the ordering is arbitrary, the resultant filter is not unique for a given set of design frequencies. For the mth path 16, the $T_m$ frequency responds at frequency $\omega_m$, while the $Z_m$ transfer function 28 is designed to place a null (or zero) in the frequency response at frequency $\omega_{m-1}$.

Once the M design frequencies have been chosen and ordered, the sequential design procedure occurs in the following manner. The transfer function $T_0$ 32 is designed to achieve the desired frequency response at the initial frequency, $\omega_0$. Since the desired frequency response has been achieved at this initial design frequency, the goal is to prevent this value from being altered by the succeeding transfer function 24. To accomplish this, $Z_1$ 36 is designed to generate a null at the initial design frequency, $\omega_0$. To ensure design flexibility in the passband, transition band and stopband regions of the filter, transfer filter $Z_1$ may not contain any other nulls in these regions. However, transfer filter $Z_1$ 36 could generate extra nulls that fall into the stopband region of the filter if the design strategy is modified in this region to allow the frequency response to be either matched or nulled. Once $Z_1$ is completed, the next design frequency, $\omega_1$, is chosen and the transfer function $T_1$ 34 is designed to achieve the desired frequency response at $\omega_1$. Since $Z_1$ 36 and $T_1$ 34 are cascaded, the null generated by $Z_1$ 36 will prevent any effect on the frequency response achieved by $T_0$ 32 at $\omega_0$. This result is independent of the choice of $T_1$ 34. In this manner, the frequency response at each design frequency can be exactly matched and not experience any degradation from frequency responses generated at the other design frequencies. Since the basic design structure allows each path to be generated separately, the mathematical difficulty in determining the desired delay coefficients is greatly reduced when compared to search techniques in general.

Figure 3:
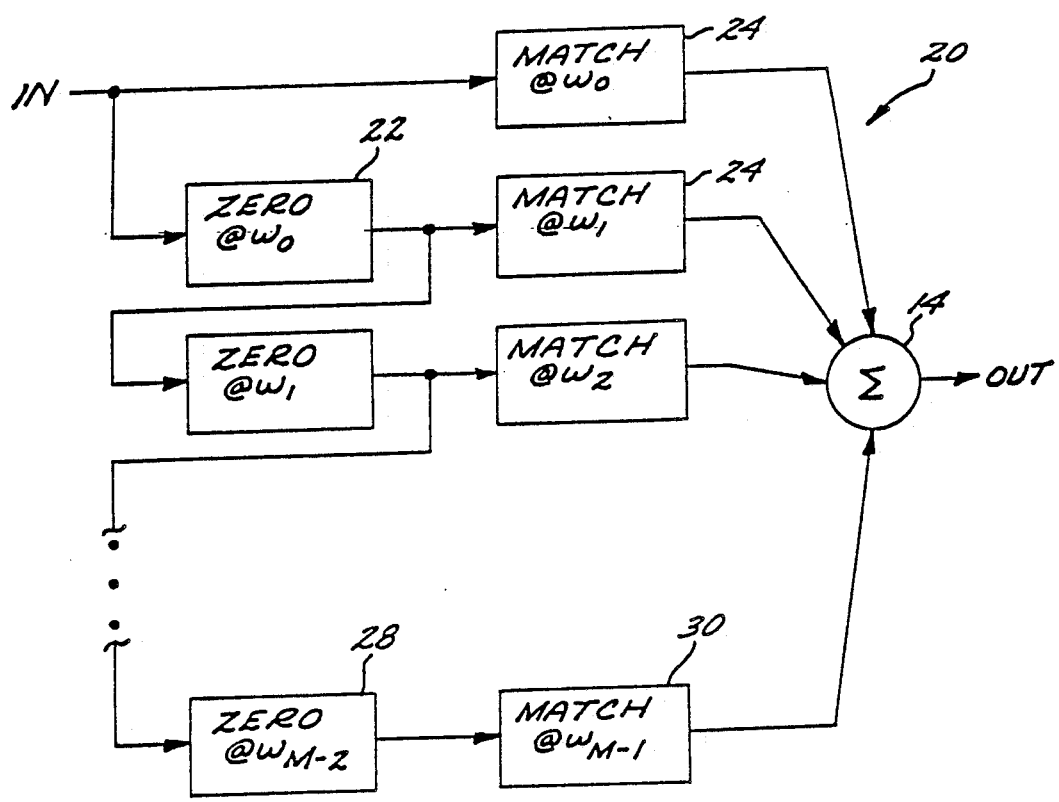
FIG. 3 is a functional description of the design structure of FIG. 2 illustrating the relationship of the matched filters and the zero, or nulling filters.

FIG. 3 illustrates, for a set of design frequencies $\{\omega_0, \omega_1, \ldots, \omega_{m-1}\}$, the basic design structure 20 in its functional form. The $Z_i$ transfer function will place a zero in the frequency response at design frequency $\omega_{i-1}$. The $T_i$ transfer function will be designed to match the desired frequency response at the design frequency, $\omega_i$. Since the Z transfer functions are cascaded, the effective nulling transfer functions at the ith branch is $Z_1 Z_2 \ldots Z_i$ which ensures that nulls will occur at design frequencies $\omega_0, \omega_1, \ldots, \omega_{i-1}$. The choice of $T_i$ can therefore be chosen to match the desired frequency response independently of the previous $T_0, T_1, \ldots, T_{i-1}$ transfer functions.

Each transfer function in the basic design structure has the same form as the basic filter structure which is described by the mathematical expression in Eq. 1. The number and values of the associated delay coefficients are determined by the design requirements for each block. Although the basic design structure may be factored into many forms, the following form has been found useful. Using the expression in Eq. 1, the following equivalent mathematical structure can be written

EQUATION 2

$$\begin{aligned} F_N(\omega) &= \pm e^{ja_0\omega} \pm e^{-ja_1\omega} \pm \ldots \pm e^{-ja_{N-1}\omega} \\ &= e^{-ja_0\omega}[\pm 1 \pm e^{-jb_1\omega} \pm \ldots e^{-jb_{N-1}\omega}] \\ &= e^{-ja_0\omega} \sum_{=0}^{N-1} \end{aligned}$$

where $b_i = a_i - a_0$ for $i = 0, 1, \ldots, N-1$.

Figure 4:
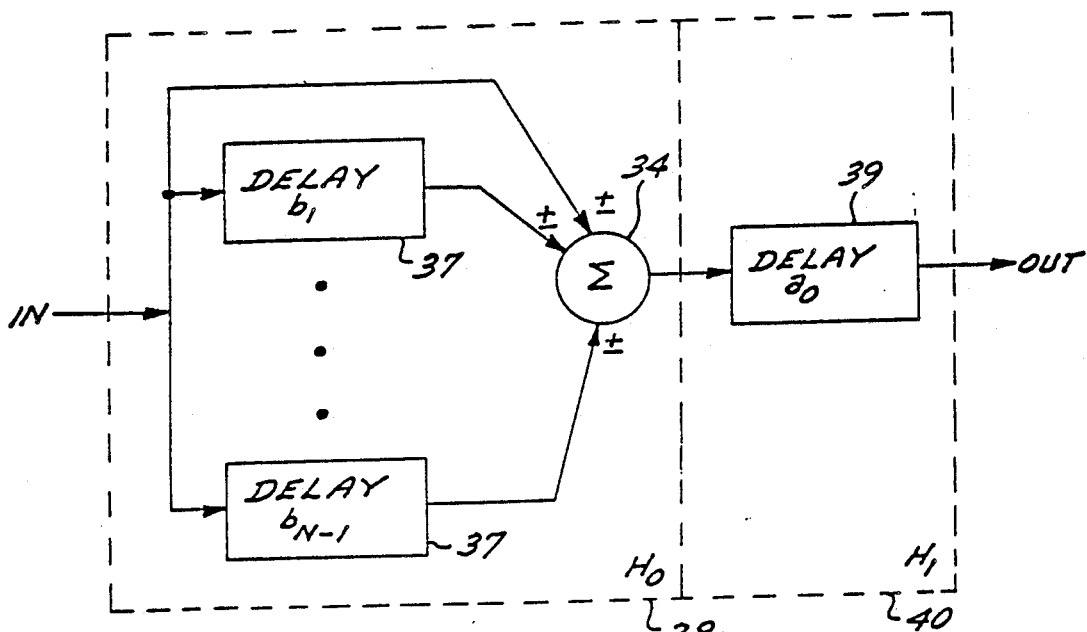
FIG. 4 illustrates a form of the present invention available for use as a filter element and which incorporates a delay element in series with a parallel array to allow for more accurate matching of the resultant response of the filter elements.

This structure is illustrated in FIG. 4 and shows the relationship between the delay transfer function $b_1$ through $b_{N-1}$ 37 that are summed at summing means 34 in sub-filters $H_0$ 38 and the subsequent delay transfer function $A_0$ 37 in sub-filter $H_1$ 40.

The design goal for each transfer function structure used is to either match the desired frequency response or place a null at a particular design frequency. Since the frequency response is a complex-valued function, it may be specified by either its real and imaginary values or by its corresponding magnitude and phase values. The design of a filter structure according to the present invention can be a two part process. The block associated with transfer function $H_0$ can achieve the required magnitude by combining vectors of unity length that are rotating at different rates.

Figure 5:
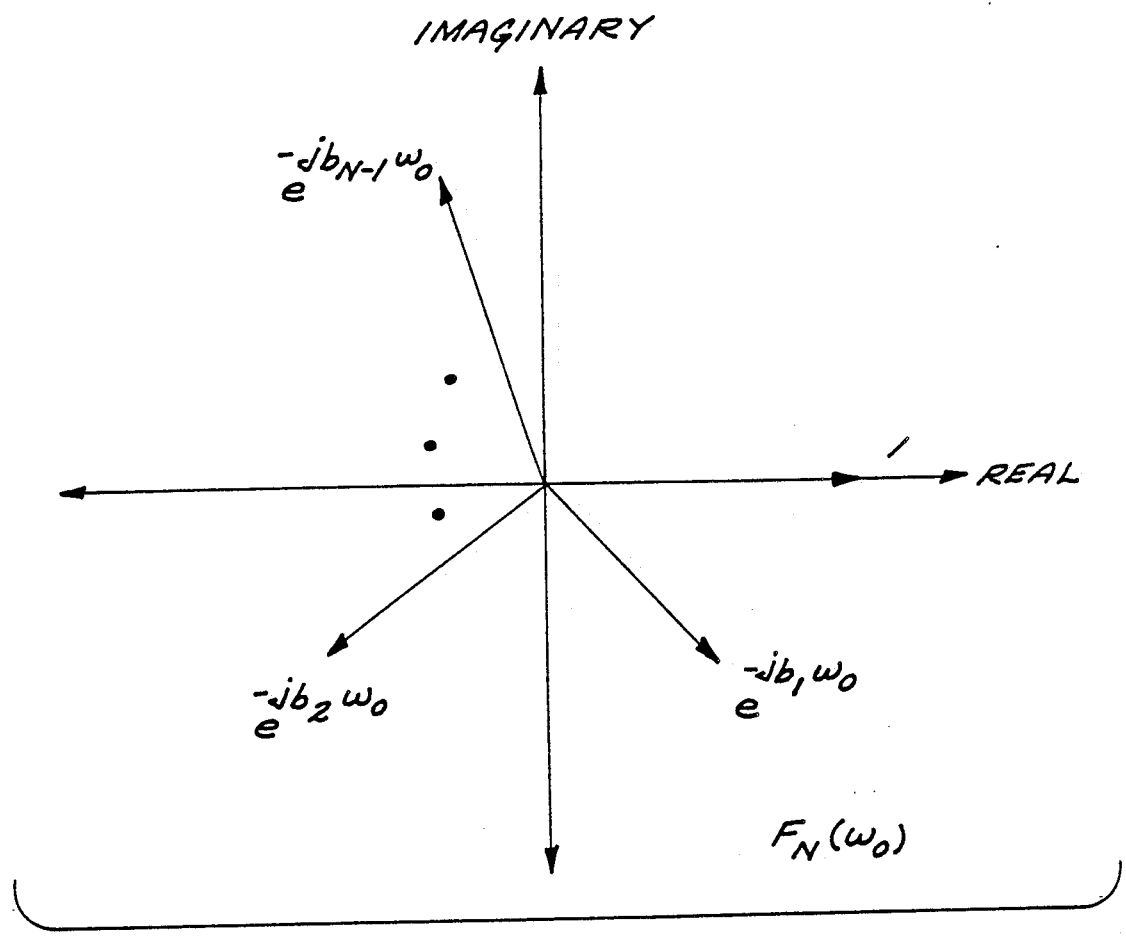
FIG. 5 is a phasor diagram of the frequency response of a filter element illustrating the relationship between the real and imaginary axes and the phase-magnitude phasor for a filter element.

FIG. 5 illustrates the relationships of the phase, magnitude and real and imaginary frequency components where each phasor has a magnitude equal to one and the rate at which the phasor rotates is proportional to its corresponding delay value, $b_1$. At a particular design frequency, the phasors are vectorially combined to determine the resultant magnitude and phase. In general, the resulting phase term generated by transfer function $H_0$ will not satisfy the desired phase term at the design frequency. Therefore, transfer function $H_1$ allows the resultant magnitude vector determined by $H_0$ to be rotated to achieve the desired phase value. Since the values associated with each term in $H_0$ is periodic (with the exception of the constant value), the resultant design will not be unique. To reduce the multiplicity of potential design solutions, the designer should choose the minimum values of the delay parameters for the filter structure chosen. This choice will reduce the fluctuations that may occur in the frequency response between design frequencies.

Figure 6:
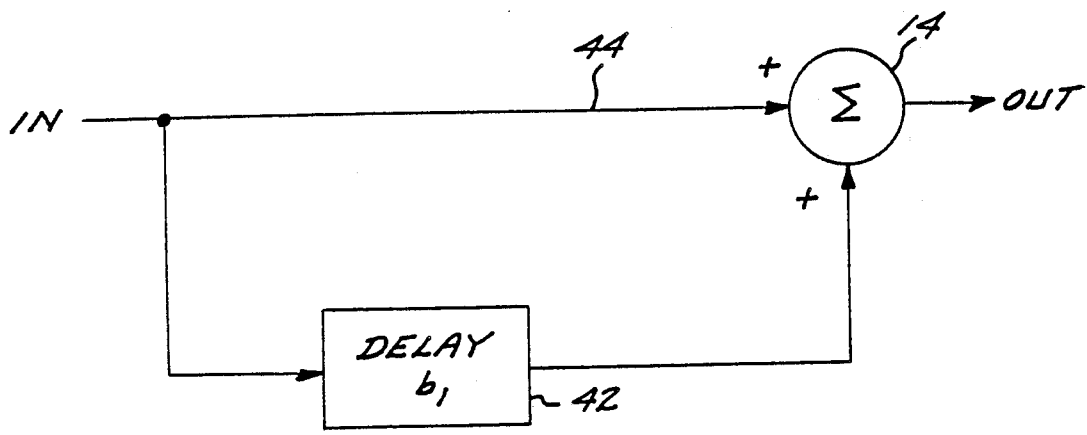
FIG. 6 is an illustration of the simplest, non-trivial filter block that can be designed for the present invention incorporating a single filter element and the summing means.

To demonstrate the design technique, the specification of a Z transfer function block will be generated where a null is desired at $\omega=5$. FIG. 6 illustrates the simplest, nontrivial filter block that can be designed occurs when $N=2$. In this example, delay transfer function 42 is combined with the direct signal input path 44 by summing means 14 to create the desired overall transfer function. The frequency response for this filter is given by the expression

EQUATION 3

$$F_2(\omega) = 1 + e^{-jb_1\omega}$$

This expression can place a null at any desired frequency in the particular frequency band of interest. To generate a null at $\omega=5$, the following expression must be satisfied

EQUATION 4

$$F_2(5) = 0$$

Since a multiplicity of delay coefficients satisfy Eq. 4, the design approach of the present invention chooses the minimum value of the delay coefficient which for this case is $b_1=0.6283$. The resultant idealized magnitude response for $F_2(\omega)$ is illustrated in FIG. 7 and indicates that a null occurs at $\omega=5$.

To further illustrate the benefits of the design procedure and filter structure of the present invention, the following is a discussion of the process as applied for a low pass filter where the phase response is arbitrarily assumed to be zero over the frequency range of interest. For this design, the magnitude and phase information was converted into a set of real and imaginary components. The real components were arbitrarily set equal to the corresponding magnitude values and the imaginary components were then forced to be zero over the frequency range of interest.

The set of design frequencies are arbitrarily chosen to be 0, 5, 6.5, 8.5 and 10.

The dots in FIG. 8 indicate the magnitude of the response associated with each of the five frequencies used in the filter design. Using a maximum of three delays for the nulling filters and a maximum of two delays for the matching filters, the resultant frequency response may be accomplished with about 80 delay transfer functions. The resulting magnitude and phase plots of the filter are shown in FIGS. 9 and 10, respectively, based upon the results of a computer simulation of the filter designs generated by the process.

Figure 9:
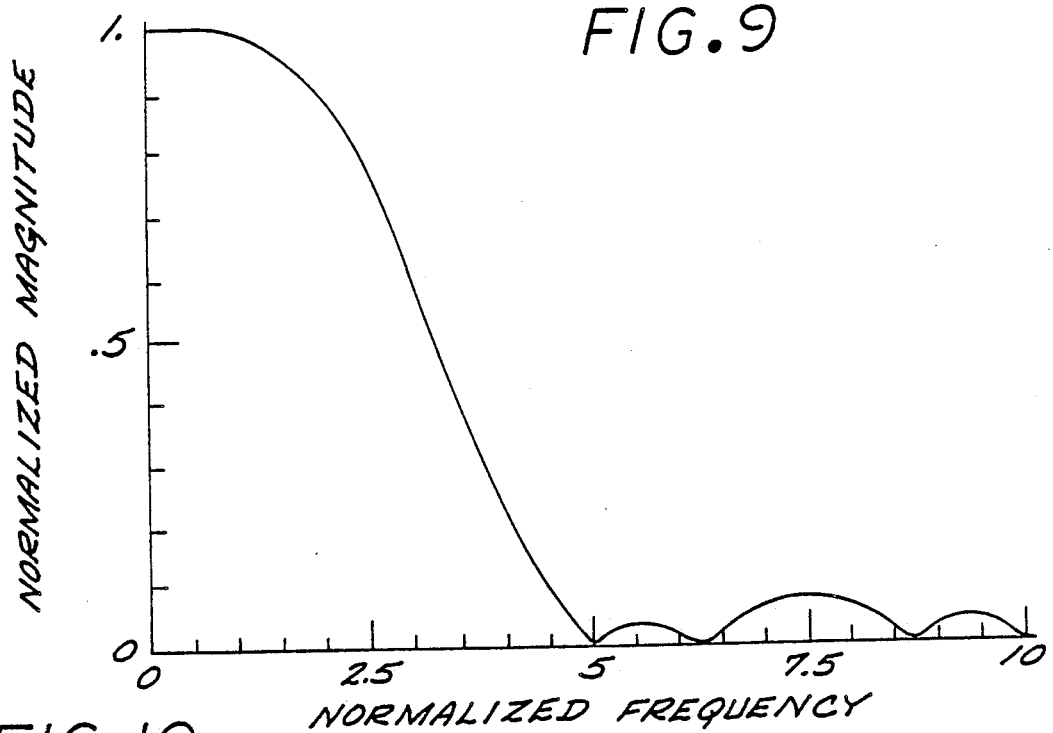
Figure 10:
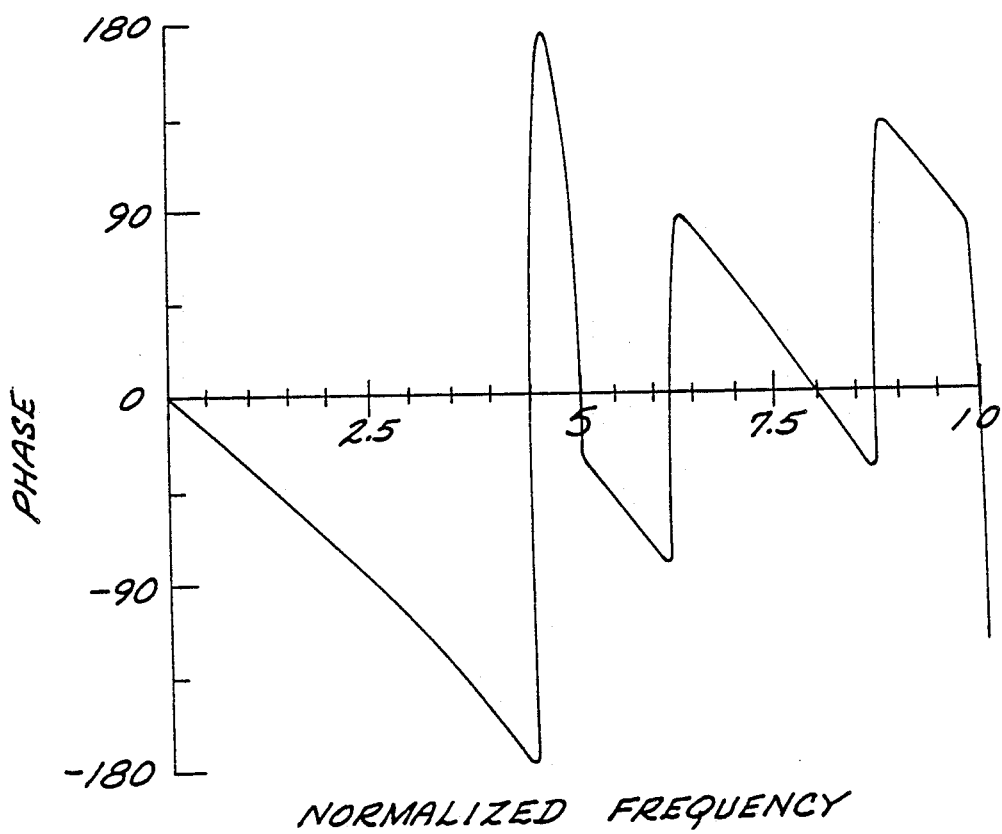
FIG. 10 is a phase-frequency plot of the filter response of the low pass filter example.

In FIG. 9, the dots indicate the value of the desired magnitude response at each of the design frequencies. The plot of predicted filter performance indicates that there was a close match between the values desired and those achieved. Similarly, in FIG. 10, the dots indicate the desired phase response was also achieved at each of the design frequencies. The sequential design technique of the present invention allows each value of the desired frequency response to be achieved independently. Therefore, as additional design frequencies are incorporated, the resultant frequency response will become a better approximation to the desired frequency response over a finite band of frequencies.

It is readily apparent from the above discussion that the present invention represents a new and useful means of configuring filters that have high performance but are relatively easily designed and use readily available components. While the above example will be of obvious use to those familiar with the electronic disciplines, the following example will serve to illustrate the more general applicability of the invention.

Figure 11:
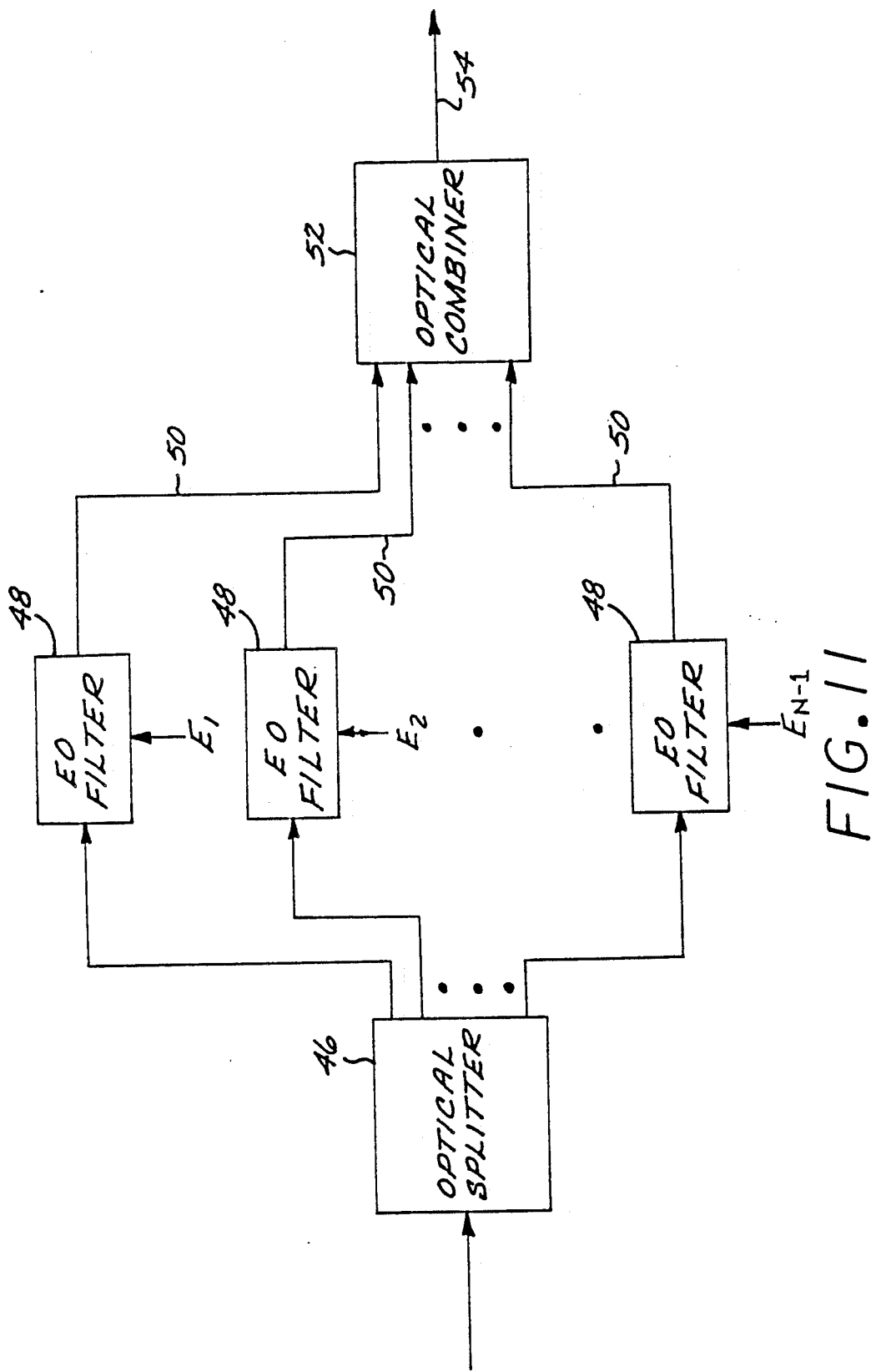
FIG. 11 is a schematic representation of an electro-optical filter concept incorporating the present invention.

FIG. 11 illustrates a schematic representation of how the present invention may be incorporated in an optical filter. As may be seen from the accompanying diagram, an analogous input to an electrical signal may be provided by optical splitter 46 which has as its output light beams that may be filtered by electro-optical filters 48 having the characteristics described above for the basic invention. The output 50 of these devices may be combined using an optical combiner 52 to create a composite output signal 54 incorporating the filter characteristics of the filter devices as discussed above. The desired phase control of the input frequency can be achieved by either of two methods. One method would control the length of an isotropic crystal, for instance, $LiNbO_3$, through which the signal propagates to achieve the desired phase rotation. This method is similar in concept to the methods discussed above. Another method using electro-optical devices would fix the length of the crystal and control the phase in each path with an externally applied electric field. The second alternative appears to be easily implemented since any errors in cutting crystals of a certain length can be eliminated utilizing the tuning capability provided by the electronic field. The concept of electrically tuning the desired delays in the electro-optic sub-filters can also be applied to other applications of the invention. For example, by placing a crystal whose properties can be modified by an electric field inside a wave guide, any errors associated with wave guide length or signal propagation velocity can be corrected by electrical tuning. Therefore, the fabrication tolerance can be relaxed when building such filters thereby reducing the filter cost. Electrical tuning also allows the filter characteristics to be rapidly modified. This property allows a fixed filter structure to adapt to a wide variety of filter frequency responses by external electronic control. If such control is connected to a computer, the programming of various filter characteristics may also be implemented. As may be seen from this example, the present invention has many applications to filters throughout the electro-magnetic spectrum and the techniques described can be utilized for various filter concepts using components appropriate to the frequencies of interest. While application of this invention to various specialized fields such as optics may require further study and adaption of the invention to specific circumstances, it can readily be seen that the invention has great potential to provide equivalent results in optics to those readily apparent from its application to the electronic disciplines.

As may be readily seen from the above description, the present invention represents a new and important structure and design method for filters. Filter designs implemented according to the invention have the potential to improve filter performance for a wide variety of analog, digital and optical systems while being relatively easily designed and implemented using readily available design tools, computers and hardware concepts. Thus, the present invention represents a significant advance in the art of filter design and structure.

While a particular form of the invention has been illustrated and described, it will also be apparent to those skilled in the art that various modifications can be made without departing from the spirit and scope of the invention. Accordingly, it is not intended that the invention be limited except as by the appended claims.

What is claimed is:

1. A filter structure which comprises a first plurality of filter elements each consisting of an array of delay elements arranged in parallel, and summing means to receive the output of said delay elements to produce a composite filtered output thereof, each delay element having a delay parameter individually selected as a function of an arbitrarily ordered set of frequencies exactly matched to a desired frequency response;

a second plurality of filter elements each consisting of an array of delay elements arranged in parallel, and summing means to receive the output of said delay elements to produce a composite filtered output thereof, each said delay element having a delay parameter individually selected as a function of an arbitrarily ordered set of frequencies exactly matched to a desired frequency response, said second plurality of filter elements being connected with said first plurality of filter elements in cascade array, and each filter element in said second plurality of filter elements having means to attenuate the input frequency, each of said filter elements in said first plurality of filter elements having as an input signal said arbitrarily ordered set of input frequencies passed by preceding ones of said filter elements in said second plurality of filter elements;

and means to sum the output of said first plurality of filter elements to provide a composite output signal of desired amplitude and phase.

2. The filter structure of claim 1, wherein said delay elements further comprise delay elements having a time lag function of exponential form.

3. The filter structure of claim 1, wherein said filter structure comprises an electro-optical filter.

4. The filter structure of claim 3, wherein said delay elements comprise means to alter a portion of the input frequency of an optical signal.

5. The filter structure of claim 4, wherein said filter elements in said second plurality of filter elements comprise means to attenuate an optical signal at a desired frequency.

6. The filter structure of claim 3 which further comprises: optical beam splitting means operative to provide a multiplicity of input beams for said delay elements.

7. A frequency filter for electro-magnetic signals which comprises;

a first plurality of filter elements arranged in parallel, and a second plurality of said filter elements connected with said first plurality of filter elements in cascade, each filter element of said second plurality of filter elements being connected between an input signal and one of said filter elements in said first plurality of filter elements, each of said filter elements in said second plurality of filter elements having a frequency null at the response frequency of said filter elements in said first plurality of filter elements and serving to essentially prevent the passage of signals of the frequency filtered by said first plurality of filter elements, each said filter element consisting of an array of delay elements arranged in parallel, each delay element having a delay individually selected as a function of an arbitrarily ordered set of frequencies exactly matched to a desired frequency response at a predetermined input frequency, each delay element having a time lag function of exponential form, an input signal being applied to each delay element of said array of delay elements; and summing means connected to receive the output of said delay elements to produce a composite filtered output thereof.

8. A frequency filter for electro-magnetic signals which comprises:

a first plurality of filter elements arranged in parallel, and a second plurality of said filter elements connected with said first plurality of filter elements in cascade, each filter element of said second plurality of filter elements comprising a notch filter connected between an input signal and one of said filter elements in said first plurality of filter elements, each of said filter elements in said second plurality of filter elements having a frequency null at the response frequency of said filter elements in said first plurality of filter elements and serving to essentially prevent the passage of signals of the frequency filtered by said first plurality of filter elements, each said filter element consisting of an array of delay elements arranged in parallel, each delay element having a delay individually selected as a function of an arbitrarily ordered set of frequencies exactly matched to a desired frequency response at a predetermined input frequency, each delay element having a time lag function of exponential form, an input signal being applied to each delay element of said array of delay elements; and summing means connected to receive the output of said delay elements to produce a composite filtered output thereof.

9. A frequency filter for electromagnetic signals which comprises:

a first plurality of filter elements arranged in parallel, with a first one of said filter elements being connected to receive a source input signal;

remaining ones of said first plurality of filter elements being connected to receive an input signal from a second plurality of filter elements connected in cascade with the remaining ones of said filter elements in said first plurality of filter elements, with a first one of said second plurality of filter elements being connected to receive said source input signal;

each of said filter elements in said first and second plurality of filter elements having a summed array of delay elements arranged in parallel, with each said delay element receiving an input signal and providing an output signal, and a means for summing the outputs of said delay elements to produce a composite filtered output, each of said delay elements having a delay parameter individually selected as a function of an arbitrarily ordered set of frequencies exactly matched to a desired frequency response; and each of said second plurality of filter elements having a frequency null at the response frequency of preceding ones of said filter elements in said first plurality of filter elements to essentially prevent the passage of signals of the frequency filtered by said preceding ones of said filter elements in said first plurality of filter elements; and means for receiving and summing the output from said first plurality of filter elements to produce a composite output of desired amplitude and phase.

* * * * *